US011546974B2

(12) United States Patent
Liu et al.

(10) Patent No.: US 11,546,974 B2
(45) Date of Patent: Jan. 3, 2023

(54) CONDUCTIVE FABRIC AND ITS PREPARATION AND APPLICATIONS

(71) Applicant: FORMOSA TAFFETA CO., LTD., Touliu (TW)

(72) Inventors: Fang-Jong Liu, Touliu (TW); Hsing-Nan Chung, Touliu (TW); Meng-Yueh Wu, Touliu (TW)

(73) Assignee: FORMOSA TAFFETA CO., LTD., Touliu (TW)

( * ) Notice: Subject to any disclaimer, the term of this patent is extended or adjusted under 35 U.S.C. 154(b) by 60 days.

(21) Appl. No.: 17/072,337

(22) Filed: Oct. 16, 2020

(65) Prior Publication Data

US 2021/0120634 A1 Apr. 22, 2021

(51) Int. Cl.
*H05K 1/09* (2006.01)
*H05K 9/00* (2006.01)
(Continued)

(52) U.S. Cl.
CPC .............. *H05B 3/342* (2013.01); *H05K 1/038* (2013.01); *H05K 3/184* (2013.01); *H05K 1/09* (2013.01);
(Continued)

(58) Field of Classification Search
CPC .......... H05K 1/09; H05K 1/038; H05K 3/184; H05K 9/00; H05K 9/009; H05K 9/0015; H01M 4/32; H01M 4/52; H01M 4/64; H01M 4/66; H01M 4/70; H01M 4/74; H01M 4/505; H01M 4/525; H01M 4/583; H01M 4/661; H01M 4/667; H01M 4/668; H01M 4/747; H01M 4/808

USPC ............... 361/749; 174/388; 429/223, 231.6, 429/231.8, 231.95, 232; 524/147, 495, 524/502, 504
See application file for complete search history.

(56) References Cited

U.S. PATENT DOCUMENTS 4,508,414 A * 4/1985 Kusui ................ H01R 13/6592
439/607.47
2004/0094904 A1 * 5/2004 Grant ..................... F16J 15/027
277/628
(Continued)

FOREIGN PATENT DOCUMENTS

CN 101302719 A 11/2008
CN 101567231 A 10/2009
(Continued)

OTHER PUBLICATIONS

First. Office Action dated Feb. 21, 2022 for Chinese Patent Application 201910993297.7 (5 pages).
(Continued)

*Primary Examiner* — Xiaoliang Chen
(74) *Attorney, Agent, or Firm* — Rimon PC

(57) ABSTRACT

The present invention provides a conductive fabric comprising base cloth and a conductive metallic circuit structure formed on the surface of the base cloth. The conductive metallic circuit structure comprises at least one metallic seed layer and at least one chemical-plating layer. The metallic seed layer is an evaporation-deposition layer or a sputter-deposition layer and has a circuit pattern. The chemical-plating layer is applied over the surface of the metallic seed layer. The conductive fabric has improved conductivity and heat generation efficiency.

9 Claims, 5 Drawing Sheets

(51) Int. Cl.
*H01M 4/32* (2006.01)
*H01M 4/52* (2010.01)
*H01M 4/64* (2006.01)
*H01M 4/66* (2006.01)
*H01M 4/70* (2006.01)
*H01M 4/74* (2006.01)
*H01M 4/505* (2010.01)
*H01M 4/525* (2010.01)
*H01M 4/583* (2010.01)
*H05B 3/34* (2006.01)
*H05K 1/03* (2006.01)
*H05K 3/18* (2006.01)

(52) U.S. Cl.
CPC ............... *H05K 2201/0344* (2013.01); *H05K 2203/072* (2013.01)

(56) References Cited

U.S. PATENT DOCUMENTS

| | | | | |
|---|---|---|---|---|
| 2004/0152808 A1* | 8/2004 | Tezuka | ................... | C08L 77/00 524/495 |
| 2004/0238516 A1 | 12/2004 | Bulgajewski | | |
| 2008/0063942 A1* | 3/2008 | Okuno | ................... | H01M 4/747 429/232 |
| 2008/0085453 A1* | 4/2008 | Okuno | ................... | H01M 4/64 429/223 |
| 2008/0176082 A1* | 7/2008 | Sakagawa | ............... | B32B 27/30 442/376 |
| 2010/0276289 A1* | 11/2010 | Tezuka | ................... | C08L 67/02 205/50 |
| 2012/0111627 A1* | 5/2012 | Kato | ........................ | D04H 3/14 174/388 |
| 2015/0017550 A1* | 1/2015 | Nishimura | ............ | H01M 4/808 429/231.95 |
| 2016/0374147 A1 | 12/2016 | Song et al. | | |
| 2018/0289082 A1 | 10/2018 | Burrows et al. | | |

FOREIGN PATENT DOCUMENTS

| | | |
|---|---|---|
| CN | 103533764 A | 1/2014 |
| CN | 108909057 A | 11/2018 |
| CN | 210984309 U | 7/2020 |
| CN | 211481517 U | 9/2020 |
| DE | 102009033510 A1 | 5/2010 |
| EP | 1939324 A1 | 7/2008 |
| GB | 2010650 A | 6/1979 |
| KR | 20060022234 A | 3/2006 |
| TW | 201924552 A | 7/2019 |
| TW | 201924552 A | 7/2019 |
| WO | 2004001775 A1 | 10/2005 |
| WO | WO-2019/086038 A1 | 5/2019 |

OTHER PUBLICATIONS

Extended European Search Report, European Patent Application EP 20202283, Completion Date Dec. 2, 2020, 13 pp.
WPI Database, Clairvate Analytics, 2017, 1 pp.

* cited by examiner

CONDUCTIVE FABRIC AND ITS PREPARATION AND APPLICATIONS

PRIORITY CLAIM AND CROSS-REFERENCE

This application claims priority to Taiwan Patent Application No. 108137790 filed on 18 Oct. 2019, which is incorporated herein by reference.

TECHNICAL FIELD

The present invention relates to a conductive fabric, especially to a conductive fabric with improved conductivity, which also saves cost.

BACKGROUND

Conventional methods for forming a conductive fabric with circuit generally include printing conductive paste onto cloth, inserting metallic threads into cloth through weaving (or knitting), and the like. The method of printing conductive paste comprises blending polymer with metallic or other conductive powder; and then directly printing conductive paste onto the surface of cloth with a predetermined pattern via screen printing or other printing techniques. The method of inserting metallic threads into cloth comprises inserting metallic threads into cloth with a predetermined pattern through weaving (or knitting), and thus the metallic threads are woven (or knit) together with other materials such as wool, nylon, cotton, and synthetic blends. In these ways, a fabric with a conductive circuit can be provided.

There are several limitations associated with these conventional methods. For example, silver paste is generally used as the conductive paste. However, silver paste is expensive and thus increases the cost for making a conductive fabric. As to fabric knitted or woven with metallic thread, the content of the metallic thread has to be limited to keep the fabric flexible. In contrast, to achieve the conductivity (such as 5Ω) as achieved by the conductive paste, the content of the metallic threads has to be increased. It is a dilemma to achieve a desired conductivity of the fabric without reducing flexibility. Accordingly, for conventional methods, it is difficult to provide a high-quality conductive fabric at low cost. Therefore, there is a need to produce a conductive fabric with desired conductivity and heat generation efficiency in a cost-effective manner.

SUMMARY OF THE INVENTION

The objective of the present invention is to provide a conductive fabric with enhanced conductivity and heat generation efficiency which also saves cost. Moreover, the objective is to allow improved adhesion between the metallic circuit and a base cloth.

To achieve the objective, the present invention provides a conductive fabric, comprising:
 base cloth; and
 a conductive metallic circuit structure formed on a surface of the base cloth with a circuit pattern, including at least one metallic seed layer and at least one chemical-plating layer;
 wherein the metallic seed layer is an evaporation-deposition layer or a sputter-deposition layer and has the circuit pattern; and the chemical-plating layer is applied over the metallic seed layer.

In some embodiments, the conductive fabric further has at least one carbon layer, covering at least a portion of the base cloth and at least a portion of the conductive metallic circuit structure.

The present invention also provides a process for producing a conductive fabric, comprising:
 providing base cloth;
 forming at least one metallic seed layer on the base cloth using evaporation or sputtering, wherein the metallic seed layer has a predetermined circuit pattern; and
 forming at least one chemical-plating layer over the metallic seed layer through a chemical plating method, whereby the metallic seed layer and the chemical-plating layer form a conductive metallic circuit structure.

In some embodiments, the process for producing a conductive fabric further comprises applying at least one carbon layer to cover at least a portion of the base cloth and at least a portion of the conductive metallic circuit structure.

The present invention also provides an article comprising the aforementioned conductive fabric.

In the present invention, the base cloth is first formed with the metallic seed layer having a specific pattern and then formed with a chemical-plating layer over the metallic seed layer through a chemical plating method, so that a conductive metallic circuit structure is formed on the base cloth. The conventional method of printing conductive ink (particularly silver paste) can be replaced by the process of the present invention to save cost. The conductivity and heat generation efficiency can be controlled though slight adjustment of the amount of metal in the chemical-plating layer. Therefore, the present invention is beneficial in achieving desired conductivity and heat generation efficiency.

The detailed technology and preferred embodiments implemented for the subject invention are described in the following paragraphs for persons skilled in this field to well appreciate the features of the claimed invention.

DETAILED DESCRIPTION OF THE DISCLOSURE

Figure 1:
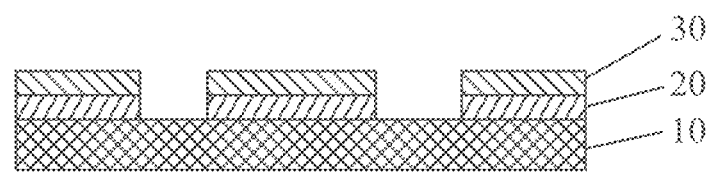
FIG. 1 is a side view of a conductive fabric without a carbon layer, in accordance with some embodiments of the present invention.

Hereinafter, some embodiments of the present invention will be described in detail. However, the present invention may also be practiced in various different forms without departing from the spirit of the present invention. The scope of the present invention shall not be considered to be limited to what is illustrated herein. In addition, unless additional explanation is given, the expressions "a," "the," or the like recited in the specification (especially in the claims) should include the singular and the plural forms. Further, for the sake of definiteness, the sizes of the elements or areas in the figures may be exaggerated rather than depicted according to their actual size ratios.

Also, it should be understood that any numerical range recited herein is intended to include all sub-ranges and numbers subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10, such as 2 to 8, 3 to 6, 4 to 9, and numbers, such as 1, 3, 5, 7 and 10.

In this context, the term "about" is used to indicate that a value measured by persons skilled in this field includes the acceptable variation of error which is determined to a certain extent by how the measurement is carried out.

The term "evaporation" used in the text indicates a deposition of films onto substrates by electron beam heating or resistance heating materials to be deposited under high vacuum to a temperature for melting such materials, so that vaporized atoms reach and attach onto the substrates. During evaporation, the temperature of the substrate greatly influences the properties of the evaporated films. Generally, the substrate should be properly heated, so that the evaporated atoms gain enough energy so as to freely diffuse across the surface of the substrate to form a uniform film. In the present invention, the base cloth should be heated to a proper temperature. The temperature may depend on the species of the base cloth and conditions of evaporation (such as vacuum degree).

With respect to the "sputtering" used in the text, for metal materials, "direct current (DC) sputtering deposition" (but not limited thereto) is usually employed, which is the simplest way to generate plasma. When using DC plasma for sputtering films, the substrate to be deposited has to be electrically conductive. In general, the "target" is the cathode used in the sputtering procedure. The target becomes thinner as the sputtering deposition is proceeding. Therefore, fully utilized targets should be replaced by new ones when appropriate.

"High power impulse magnetron sputtering (HIPIMS)" is another method for sputtering metal, based on magnetron sputter deposition using a high power impulse power supply. High-density plasma (high electron density) is created by applying a high power pulse at a short time-interval. Such HIPIMS deposition system efficiently enhances ionization of sputtered material, so as to obtain a film without void defects but with high density and improved crystallinity at low substrate temperature. The key component for an HIPIMS system is the power supply. In an HIPIMS system, a set of DC power supplies are loaded in capacitors of a pulse module, which connects to a target holder. The electric energy of the DC power supplies is accumulated in the capacitors in the pulse module to a few hundred or thousand volts, and the pulse time and pulse frequency of the discharge can be controlled by a transistor to generate high-density plasma.

By bombarding the metal target with positive ions in the plasma, the target atoms for energy transport are sputtered from the target surface and deposited on a workpiece to form a thin film.

The "chemical plating" used in the text is also called positive ion "autocatalytic plating" or "electroless plating," which is a surface treatment technique with respect to an autocatalytic deposition of metal. During a chemical plating procedure, metal ions in the plating bath are reduced to metal using a suitable reducing agent without the application of external current. Chemical plating is different from the conventional electroplating technique, in which the application of external power supply is necessary.

Take chemical plating of copper as example. In an electroless plating solution, copper sulphate is used as the main salt providing copper as the main material; potassium sodium tartrate is used as a chelating agent; which is an important component to keep copper ions stable and control the reaction rate; formaldehyde is also an important component for the chemical plating, and is used as a reducing agent to reduce copper (II) ions to metallic copper; sodium hydroxide is used to maintain the pH value of the plating bath and accelerate the reduction when formaldehyde is used as the reducing agent; a stabilizer is used to properly control the reduction rate and avoid the decomposition of the electroless plating solution due to the reduction of copper ions when the solution is catalyzed.

With reference to FIG. 1, the present invention relates to a conductive fabric, comprising a base 10 and a conductive metallic circuit structure.

The base cloth 10 can be any kind of cloth, including, but not limited to, woven fabrics, nonwoven fabrics, knitted fabrics and the like.

The conductive metallic circuit structure is formed on the surface of the base cloth with a circuit pattern, including at least one metallic seed layer 20 and at least one chemical-plating layer 30.

The metallic seed layer 20 is an evaporation-deposition layer or a sputter-deposition layer and has the circuit pattern, wherein the metallic seed layer 20 comprises a conductive metal and preferably consists of a conductive metal, and the conductive metal includes but is not limited to stainless steel, nickel, copper, silver, titanium, nickel-vanadium alloy, aluminum, cobalt, palladium or a combination thereof; the metallic seed layer 20 may be a single layer or may include two or more layers.

The chemical-plating layer 30 is applied over the metallic seed layer 20, wherein the suitable conductive metal for forming the chemical-plating layer 30 includes but is not limited to copper, nickel, silver, gold or an alloy thereof. For example, the conductive metal used to form the chemical-plating layer can be a single metal, such as copper, nickel, silver, gold and the like or can be an alloy containing any one or more of the aforementioned metals or an alloy containing any one or more of the aforementioned metals in combination with one or more other metals. The chemical-plating layer 30 may be a single layer or may include two or more layers. When the chemical-plating layers 30 include two or more layers, the inner layer contacting the metallic seed layer 20 is electrically conductive and the outer layer(s) far from the metallic seed layer 20 comprises metal(s) with anti-oxidation function, abrasion resistance and/or other functions, so that the chemical-plating layer 30 simultaneously exhibits several functions, including, but not limited to, electric conductivity, anti-oxidation, abrasion resistance and so forth.

In the present invention, the metallic seed layer 20 has a thickness from about 20 μm to about 200 μm, preferably from about 50 μm to about 150 μm, and more preferably from 55 μm to about 120 μm. Each chemical-plating layer 30 has a thickness from about 10 μm to about 100 μm, preferably from about 15 μm to about 75 μm, and more preferably from 20 μm to about 65 μm.

Figure 2:
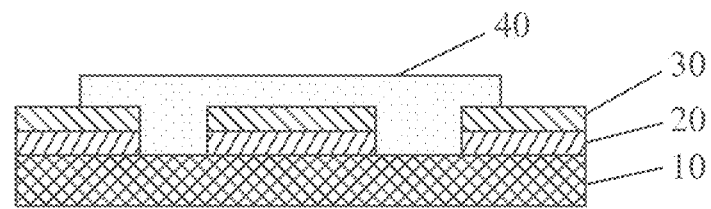
FIG. 2 is a side view of a conductive fabric with a carbon layer, in accordance with some embodiments of the present invention.

With reference to FIG. 2, the conductive fabric further comprises at least one carbon layer 40, covering at least a portion of the base cloth 10 and at least a portion of the conductive metallic circuit structure. The carbon layer 40 is made of carbon paste, comprising resin, a carbon component, an organic solvent and an optional crosslinking agent. Based on 100 parts by weight of resin, the carbon component is in an amount of about 10 to about 50 parts by weight, preferably about 20 to about 40 parts by weight, and more preferably about 25 to about 35 parts by weight; the organic solvent is in an amount of about 10 to about 50 parts by weight, preferably about 20 to about 40 parts by weight, and more preferably about 25 to about 35 parts by weight; the crosslinking agent is in an amount of 0 to about 10 parts by weight, preferably about 1 to about 8 parts by weight, and more preferably about 2 to about 5 parts by weight. The resin can be oil-based resin (also called "solvent-based resin") or water-based resin, which includes polyurethane (PU), acrylic resin such as poly(methyl methacrylate) (PMMA) or other suitable resins known in the art. The carbon component may be in the form of carbon ball, carbon tube, conductive carbon black, graphite, bamboo charcoal, coffee carbon and the like. Preferably, the carbon ball and carbon tube may have a diameter in the nanoscale. The organic solvent may be ethyl acetate, butyl acetate or a mixture thereof or other organic solvents known in the art. The crosslinking agent may be an NCO-group containing crosslinking agent, such as isocyanurate; or a carbodiimide (—N=C=N— group-containing) crosslinking agent without an NCO-group; or other crosslinking agents known in the art.

Figure 3:
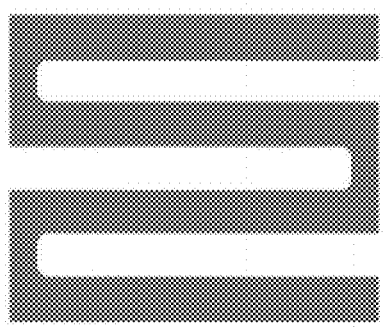
FIG. 3 is a top view of a continuous circuit pattern on the conductive fabric, in accordance with some embodiments of the present invention.
Figure 4:
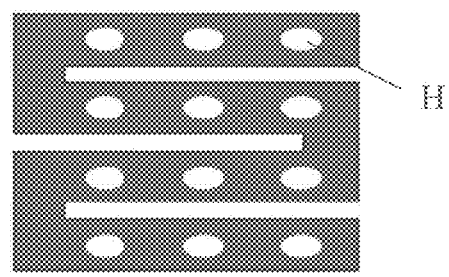
FIG. 4 is a top view of a continuous circuit pattern with a plurality of holes on the conductive fabric, in accordance with some embodiments of the present invention.
Figure 5A:
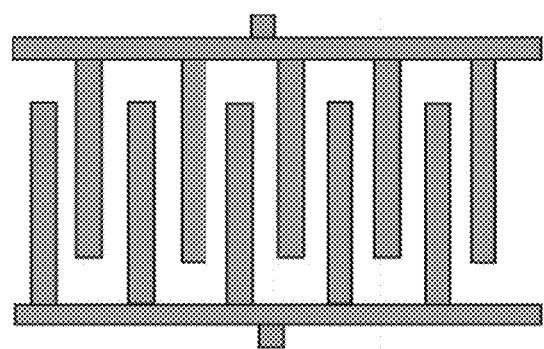
FIG. 5A is a top view of a discontinuous circuit pattern on the conductive fabric, in accordance with some embodiments of the present invention.
Figure 5B:
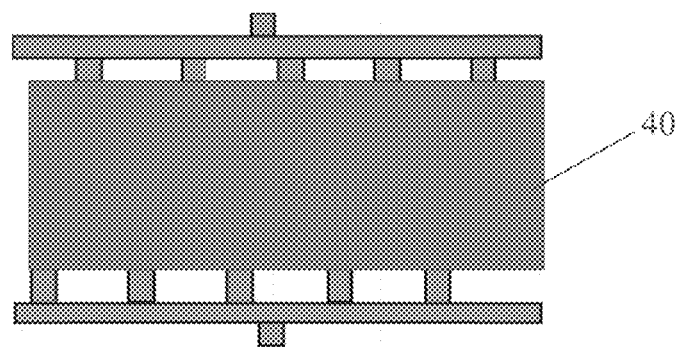
FIG. 5B is a top view of a discontinuous circuit pattern on the conductive fabric with a carbon layer, in accordance with some embodiments of the present invention.

In the present invention, the conductive circuit has a circuit pattern, which may be a continuous circuit pattern or a continuous loop pattern (as shown in FIGS. 3 and 4) or a discontinuous circuit pattern (as shown in FIGS. 5A and 5B). The shape, size, and spacing of the pattern can be designed according to the actual demand.

In some embodiments, with reference to FIG. 3, the continuous loop pattern may have a line shape, including, but not limited to, straight line or curved line. In another embodiment, with reference to FIG. 4, the continuous loop pattern may be a perforated circuit pattern with several holes H which are not covered by any conductive metal. Due to these holes H, the resistance of the conductive metallic circuit structure can be increased and may be from about 1.0 ohms/square to about 5 ohms/square, preferably from about 1.2 ohms/square to about 4.5 ohms/square, and more preferably from 1.5 ohms/square to about 4 ohms/square. Accordingly, the conductive metallic circuit structure with such perforated circuit pattern generates heat even without application of a carbon layer. However, a carbon layer may still be applied to enhance heat generation efficiency. The shape, size, and location of these holes H may be adjusted according to actual demand, so as to adjust the heat generated from the conductive metallic circuit structure (i.e. the temperature of the conductive fabric).

With reference to FIG. 5A, the conductive circuit has a discontinuous circuit pattern. In some embodiments, as shown in FIG. 5B, a carbon layer 40 may be applied to generate heat.

Figure 6A:
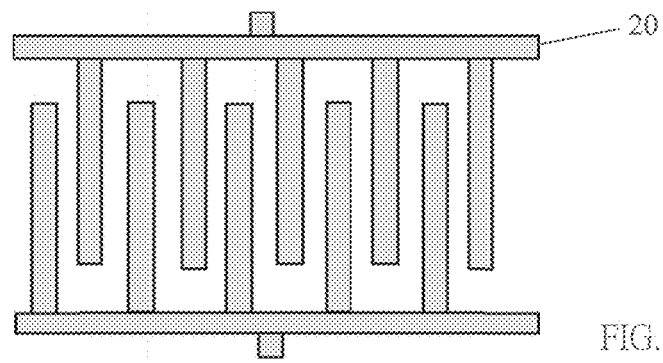
FIGS. 6A to 6D are diagrammatic top views showing the process for producing the conductive fabric, in accordance with some embodiments of the present invention.
Figure 6B:
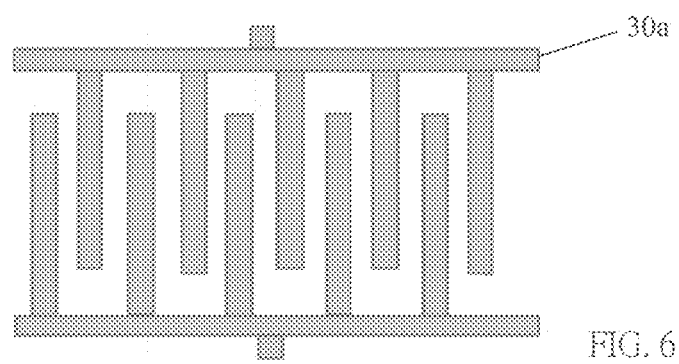
Figure 6C:
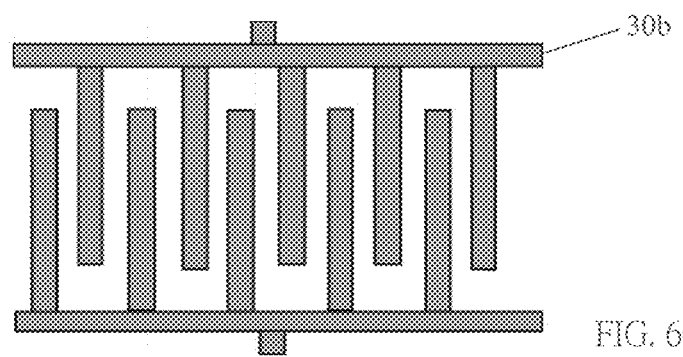
Figure 6D:
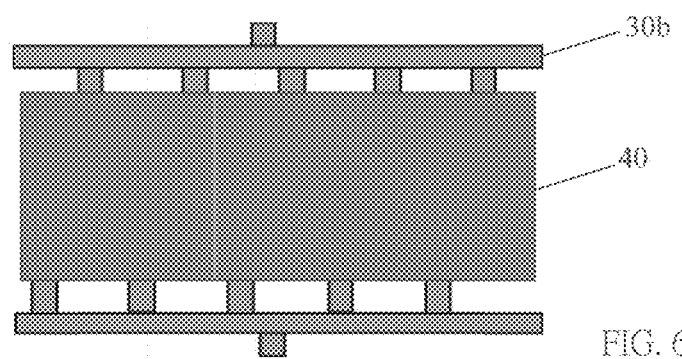

With reference to FIGS. 6A to 6D, the present invention also provides a process for producing a conductive fabric, comprising:

providing base cloth, which can be any kind of cloth, including, but not limited to, woven fabrics, nonwoven fabrics, knitted fabrics and so forth;

plating conductive metal (including, but not limited to, stainless steel, nickel, copper, silver, titanium, nickel-vanadium alloy, aluminum, cobalt, palladium or a combination thereof) on the base cloth using evaporation or sputtering through a fine mask with a predetermined circuit pattern to form at least one metallic seed layer 20, so that the metallic seed layer 20 exhibits the predetermined circuit pattern (as shown in FIG. 6A), wherein the predetermined circuit pattern may be a continuous loop pattern (as shown in FIGS. 3 and 4) or a discontinuous circuit pattern (as shown in FIGS. 5A and 5B and 6A to 6D); when the predetermined circuit pattern is a continuous loop pattern, it may comprise one or more holes which are not covered by metal;

chemical plating copper, nickel, silver, gold or other metal or alloy thereof over the metallic seed layer 20 to form at least one chemical-plating layer; in one embodiment, at least one chemical-plating copper layer 30a is formed over the metallic seed layer as shown in FIG. 6B and at least one chemical-plating nickel layer 30b as shown in FIG. 6C is then formed over the chemical-plating copper layer 30a; and optionally forming at least one carbon layer 40 to cover at least a portion of the base cloth 10 and at least a portion of the chemical-plating layer 30a, 30b (as shown in FIG. 6D); in one embodiment, forming the carbon layer 40 comprises applying carbon paste to cover at least a portion of the base cloth 10 and at least a portion of the chemical-plating layer 30a, 30b. The carbon layer 40 is used to generate heat and keep the temperature constant (thermostat).

In some embodiments, the resistance of the carbon layer 40 is from about 0.01 ohms/square to about 50 ohms/square, preferably from about 0.02 ohms/square to about 20 ohms/square, and more preferably from 0.02 ohms/square to about 5 ohms/square.

In some embodiments, the metallic seed layer and chemical-plating layer may both comprise conductive metal used for electric conduction. Through the design of the circuit pattern, these layers can also be used to generate heat. The carbon layer is used to generate heat and keep the temperature constant (thermostat). Since the resistance of the carbon layer is greater than that of the conductive metal, due to significant resistance difference in such a circuit, electrical energy converts to heat (and thus temperature rises). Generally, the resistance of the carbon layer may be designed depending on the desired heat to be generated or depending on heating area of the circuit. That is, the resistance of the carbon layer may change according to the area of the conductive circuit. The resistance of the carbon layer is inversely proportional to the carbon content and the coating amount (coating times) of the carbon layer. For example, higher carbon content in the carbon layer results in lower resistance, and thus higher temperature can be achieved.

In some embodiments, the ratio of the surface area of the conductive metallic circuit structure and that of the carbon layer is from about 1:3 to about 1:30; preferably from about 1:5 to about 1:20; and more preferably from about 1:8 to about 1:15.

With respect to the characteristics of the carbon paste, when the temperature rises, the resistance of the carbon paste increases (current decreases) and the output power (P=IV) is also reduced, so the temperature will not be further increased and thermostat can be reached.

In some embodiments, the base cloth is deposited with metal through evaporation or sputter deposition (i.e. metallic seed layer) to obtain an initial conductivity, which is not desired. The desired conductivity is about 20Ω or lower, preferably about 10Ω or lower. Therefore, the deposition of metal is further performed onto the metallic seed layer through a chemical plating method (autocatalytic reduction) to form the chemical-plating layer so as to improve conductivity (about 0.5Ω to about 5Ω), rubbing fastness (according to JIS L0849 Test Method of Colorfastness to Rubbing; rubbing 200 times at level 3 or more), salt spray corrosion resistance and the like.

The present invention also provides articles containing the conductive fabric of the present invention, which can be wearing members (including, but not limited to, clothes, hats, gloves, socks, shoes, scarfs and the like) or even seats, sofas and the like. The article may further comprise electronic appliances including, but not limited to, a light-emitting element (such as LED), a temperature-control device, a positioning device (such as GPS), an audio and video transmission system (such as MEMS microphone), any kind of sensor (such as temperature sensor, heart rate monitor and so forth), so the articles may have electric conductivity and/or thermal conductivity, audio and/or light warning effects and so on, which can be used to keep warm, transmit audio and video, monitor human vital signs and can be used for search and rescue positioning and other functions.

In some embodiments, the article produces heat and keeps temperature constant through the conductive metallic circuit structure alone or in combination with the carbon layer. Alternatively, the article may further comprise a temperature controller to adjust the temperature of the article.

In some embodiments, the article may further comprise smart appliances, including, for example, smartphones, pads, watches and the like, on which software is installed (such as apps) or including a microelectronic-based wireless electronic system.

In some embodiments, the article may further comprise current and/or voltage control modules connecting to the conductive fabric and/or other electronic elements, such as those mentioned above, and also connecting to a power supply (such as external portable power supply, internal battery or the like). The article may comprise a wireless transmitter with a wireless network using Bluetooth, infrared, Wi-Fi, NFC and so on, which is used to adjust the current and/or voltage output of the conductive metallic circuit structure on the conductive fabric.

EXAMPLES

Test Items and Methods
1. Conductivity (Ω): YF-508 MilliOHM Meter was used.
2. Resistance of the carbon layer (Ω/sq): MITSUBISHI Loresta-GP(MCP-T600) was used.
3. Sheet resistivity: JIS K 7194 was adopted for measuring initial surface resistance.
4. Rubbing fastness: JIS L0849 was adopted.
5. Salt spray corrosion resistance: JIS Z2371 was adopted for spraying neutral salt water onto the conductive fabric using neutral salt spraying tester.

Example 1

Figure 7:
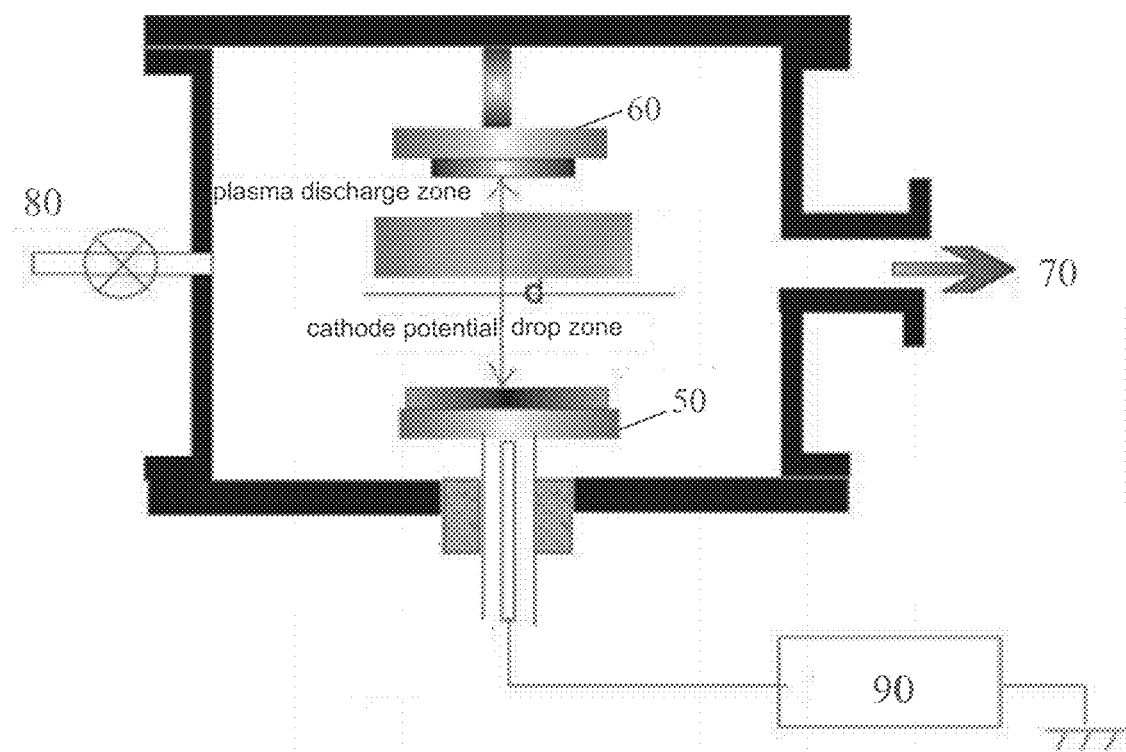
FIG. 7 is a schematic diagram showing the layout for the DC sputtering deposition used in the process for producing the conductive fabric, in accordance with some embodiments of the present invention.

I. Sputtering/Evaporation Step
Polyamide (Nylon) was provided as base cloth and stainless steel was sputtered onto the surface of the polyamide (Nylon) through a fine mask with a predetermined pattern using the DC sputtering deposition to form a metallic seed layer. FIG. 7 illustrates a general layout for the DC sputtering deposition, in which a metallic film and a base cloth (stainless steel target material and polyamide (Nylon) in Example 1) were used as a cathode 50 and an anode 60, respectively, in a chamber, which was evacuated 70 to below $10^{-3}$ Pa and then was filled with inert gas (Ar) from the gas inlet 80 to a few pascals (Pa); and high voltage (300 volts or more) was applied from a high voltage power supply 90 to create glow discharge and form plasma, in which positively charged ions (e.g., Ar+) were accelerated towards the target at several hundred volts to bombard the target and release metallic atoms of the target material through conversion of kinetic energy, which were then deposited onto the surface of the base cloth (polyamide (Nylon)), that is, the anode 60.

II. Chemical Plating of Copper
The polyamide (Nylon) with the metallic seed layer was rinsed with water to clean the surface. In this example, a chemical-plating copper layer was formed on the metallic seed layer through a chemical plating procedure with the following reaction formulae using copper sulfate as the main salt and formaldehyde as the reducing agent:

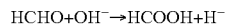
$$HCHO+OH^- \rightarrow HCOOH+H^-$$

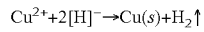
$$Cu^{2+}+2[H]^- \rightarrow Cu(s)+H_2\uparrow$$

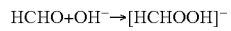
$$HCHO+OH^- \rightarrow [HCHOOH]^-$$

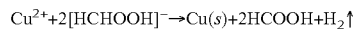
$$Cu^{2+}+2[HCHOOH]^- \rightarrow Cu(s)+2HCOOH+H_2\uparrow$$

III. Chemical Plating of Nickel
The polyamide (Nylon) was rinsed with water again to clean the surface. Nickel was deposited on the surface of the chemical-plating copper layer to form a chemical-plating nickel layer with the following reaction formulae using nickel sulfate as the main salt and sodium hypophosphite as the reducing agent:

$$Ni^{2+}+2H_2PO_2^-+3OH^- \rightarrow Ni+HPO_3^{2-}+2H_2O+H_2PO_2^-$$

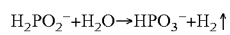
$$H_2PO_2^-+H_2O \rightarrow HPO_3^-+H_2\uparrow$$

In this way, a conductive metallic circuit structure with a predetermined pattern was formed on the polyamide (Nylon) fabric.

IV. Carbon Layer Coating Step
A carbon paste was applied onto the polyamide (Nylon) with the conductive metallic circuit structure to form and carbon layer, which covered at least a portion of the polyamide (Nylon) and at least a portion of the chemical-plating nickel layer. The proportion of the surface area of the conductive metallic circuit structure to that of the carbon layer was about 1:3. The carbon paste included 100 parts by weight of PU resin, about 30 parts by weight of graphite carbon powder, about 2 parts by weight of crosslinking agent (isocyanate, CL-325) and about 30 parts by weight of organic solvent (a mixture of ethyl acetate and butyl acetate in a weight proportion of about 4:6). The resistance of the carbon layer was about 0.25 ohm/square.

After measurement, the polyamide (Nylon) with the conductive metallic circuit structure in Example 1 has properties as shown in Table 1.

TABLE 1

| Items | Results |
| --- | --- |
| Conductivity | 2.5 ohm |
| Resistance of the conductive metallic circuit structure before the carbon layer is applied | 0.1 ohm/square |

TABLE 1-continued

| Items | Results |
|---|---|
| Resistance of the carbon layer | 0.25 ohm/square |
| Sheet resistivity | ≤20% |
| The highest temperature during the electrothermal test | ≥40° C. |
| Increasing rate of temperature | 5° C./min or more |
| Rubbing fastness | ≥level 3 |
| Salt spray corrosion resistance | change in conductivity ≤20% |

Example 2

Polyester woven (30 Denier) was provided as the base cloth. Stainless steel was sputtered onto the surface of the polyester woven to form a metallic seed layer with a thickness of about 55 μm. Subsequently, copper and nickel were chemical plated over the metallic seed layer to form chemical-plating layers. The total thickness of both chemical plating layers was about 28 μm. The conductive metallic circuit structure consisting of the metallic seed layer (stainless steel) and both chemical-plating layers (copper and nickel) had conductivity of about 5Ω. Two layers of carbon paste were applied over the conductive metallic circuit structure. The carbon layers had a resistance of about 0.35 ohm/square. The resulting conductive fabric produced heat and kept the temperature constant.

After measurement, the polyester woven with the conductive metallic circuit structure in Example 2 has properties as shown in Table 2.

TABLE 2

| Items | Results |
|---|---|
| Conductivity | 5 Ω |
| Resistance of the conductive metallic circuit structure before the carbon layer is applied | 0.3 ohm/square |
| Resistance of the carbon layer | 0.35 ohm/square |
| Sheet resistivity | ≤20% |
| The highest temperature during the electrothermal test | ≥40° C. |
| Increasing rate of temperature | 5° C./min or more |
| Rubbing fastness | ≥level 3 |
| Salt spray corrosion resistance | change in conductivity ≤20% |

Example 3

Polyester woven (30 Denier) was provided as base cloth. Stainless steel was sputtered onto the surface of the polyester woven to form a metallic seed layer with a predetermined circuit pattern, which is a continuous loop pattern with holes formed uniformly in the conductive circuit. The width of the conductive circuit pattern was about 10 mm. The holes have a circular or oval shape (as shown in FIG. 4, but the disclosure is not limited thereto). In this example, the long axis of each oval hole was about 4 mm and the short axis was about 3 mm, but the disclosure is not limited thereto. The stainless steel as the metallic seed layer had a thickness of 55 μm. Subsequently, copper and nickel were chemical plated over the metallic seed layer to form chemical-plating layers. The total thickness of both chemical-plating layers was about 30 μm. The conductive metallic circuit structure consisting of the metallic seed layer (stainless steel) and both chemical plating layers (copper and nickel) had conductivity of about 2.8Ω and resistance of about 1.5 ohm/square. The resulting conductive fabric produces heat and keeps the temperature constant.

After measurement, the polyester woven with the conductive metallic circuit structure in Example 3 has properties as shown in Table 3.

TABLE 3

| Items | Results |
|---|---|
| Conductivity | 2.8 Ω |
| Resistance of the conductive metallic circuit structure | 1.5 ohm/square |
| Sheet resistivity | ≤20% |
| The highest temperature during the electrothermal test | ≥45° C. |
| Increasing rate of temperature | 5° C./min or more |
| Rubbing fastness | ≥level 3 |
| Salt spray corrosion resistance | change in conductivity ≤20% |

The above disclosure is related to the detailed technical contents and inventive features thereof. Persons skilled in this field may proceed with a variety of modifications and replacements based on the disclosures of the invention as described without departing from the characteristics thereof. Nevertheless, although such modifications and replacements are not fully disclosed in the above descriptions, they are substantially covered in the following claims as appended.

The invention claimed is:

1. A process for producing conductive fabric, comprising:
providing base cloth;
forming at least one metallic seed layer on the base cloth using evaporation or sputtering, wherein the metallic seed layer has a predetermined circuit pattern;
forming at least one chemical-plating layer over the metallic seed layer through a chemical plating method, whereby the metallic seed layer and the chemical-plating layer form a conductive metallic circuit structure; and
forming at least one carbon layer to cover at least a portion of the base cloth and at least a portion of the conductive metallic circuit structure.

2. The process according to claim 1, wherein the carbon layer is formed by carbon paste, including 100 parts by weight of resin, about 10 to about 50 parts by weight of carbon component, about 10 to about 50 parts by weight of an organic solvent, and 0 to about 10 parts by weight of a crosslinking agent.

3. The process according to claim 1, wherein the carbon layer has a resistance from about 0.01 ohms/square to about 50 ohms/square.

4. The process according to claim 1, wherein the circuit pattern is a continuous loop pattern or a discontinuous circuit pattern.

5. The process according to claim 4, wherein the continuous loop pattern has one or more holes not covered by metal.

6. The process according to claim 1, wherein the metallic seed layer comprises conductive metal selected from a group consisting of stainless steel, nickel, copper, silver, titanium, nickel-vanadium alloy, aluminum, cobalt, palladium and a combination thereof; and the chemical-plating layer comprises conductive metal selected from a group consisting of copper, nickel, silver, gold and an alloy thereof.

7. The process according to claim 1, wherein the metallic seed layer has a thickness from about 20 μm to about 200 μm; and each chemical-plating layer has a thickness from about 10 μm to about 100 μm.

8. The process according to claim 1, wherein the conductive metallic circuit structure has conductivity of about 20Ω or lower.

9. An article, comprising the conductive fabric made by the process of claim 1.

* * * * *